United States Patent
Lee et al.

(10) Patent No.: US 8,981,778 B2
(45) Date of Patent: Mar. 17, 2015

(54) METHOD AND APPARATUS FOR IMAGING A PATIENT USING LOCAL SHIM COILS

(75) Inventors: Seung-Kyun Lee, Cohoes, NY (US);
Ileana Hancu, Clifton Park, NY (US);
Lorne Wyatt Hofstetter, Latham, NY (US)

(73) Assignee: General Electric Company, Niskayuna, NY (US)

( * ) Notice: Subject to any disclaimer, the term of this patent is extended or adjusted under 35 U.S.C. 154(b) by 995 days.

(21) Appl. No.: 13/094,602

(22) Filed: Apr. 26, 2011

(65) Prior Publication Data

US 2012/0274326 A1 Nov. 1, 2012

(51) Int. Cl.
*G01R 33/48* (2006.01)
*G01R 33/3415* (2006.01)
*G01R 33/3875* (2006.01)

(52) U.S. Cl.
CPC ........ *G01R 33/3415* (2013.01); *G01R 33/3875* (2013.01)
USPC .......................................... 324/318; 324/307

(58) Field of Classification Search
CPC ..................... G01R 33/3415; G01R 33/3875
USPC .............................. 324/300–322; 600/407–422
See application file for complete search history.

(56) References Cited

U.S. PATENT DOCUMENTS

| | | | |
|---|---|---|---|
| 6,294,972 B1 | 9/2001 | Jesmanowicz et al. | |
| 6,806,712 B2 | 10/2004 | Akgun | |
| 6,850,065 B1 * | 2/2005 | Fujita et al. | 324/318 |
| 6,856,134 B1 | 2/2005 | Reeder et al. | |
| 7,034,530 B2 | 4/2006 | Ahluwalia et al. | |
| 7,714,580 B2 | 5/2010 | Kruip | |
| 2007/0016003 A1 | 1/2007 | Piron et al. | |
| 2008/0214930 A1 | 9/2008 | Brasile | |
| 2008/0258729 A1 * | 10/2008 | Kruip | 324/320 |
| 2010/0277174 A1 | 11/2010 | Van Den Brink et al. | |
| 2011/0304331 A1 * | 12/2011 | Takahashi et al. | 324/309 |

OTHER PUBLICATIONS

Jung-Jiin Hsu et al ; "Mitigation of Susceptibility-Induced Signal Loss in Neuroimaging Using Localized Shim Coils"; Magnetic Resonance in Medicine 53:243-248 (2005); 6 pgs.
Nimrod Maril et al; "Strategies for Shimming the Breast"; Magnetic Resonance in Medicine 54:1139-1145 (2005); 7 pgs.

* cited by examiner

*Primary Examiner* — Melissa Koval
*Assistant Examiner* — Rishi Patel
(74) *Attorney, Agent, or Firm* — Melissa K. Dobson (57) ABSTRACT

A method of generating a magnetic resonance (MR) image includes applying a localized magnetic field to a portion of a patient, determining a difference between a local field strength around a first region of interest and a local field strength around a different second region of interest, adjusting the local field strength around the first region of interest such that the local field strength around the first region of interest is substantially the same as the local field strength around the second region of interest, and generating an image of the first and second regions after adjusting the local field strength around the first second region of interest. A coil apparatus and a system are also described herein.

17 Claims, 7 Drawing Sheets

METHOD AND APPARATUS FOR IMAGING A PATIENT USING LOCAL SHIM COILS

STATEMENT REGARDING FEDERALLY SPONSORED RESEARCH AND DEVELOPMENT

The United States Government may have certain rights in this invention pursuant to U.S. Government Contract Number NIH 5R01EB005307-2 awarded by the National Institutes of Health.

BACKGROUND

The subject matter disclosed herein relates generally to magnetic resonance imaging (MRI) systems, and more particularly to a method and apparatus for imaging a patient using local shim coils.

MRI or Nuclear Magnetic Resonance (NMR) imaging generally provides for the spatial discrimination of resonant interactions between Radio Frequency (RF) waves and nuclei in a magnetic field. Specifically, MRI utilizes hydrogen nuclear spins of the water molecules in the human body, which are polarized by a strong, uniform, static magnetic field of a magnet. This magnetic field is commonly referred to as $B_0$ or the main magnetic field. When a substance, such as human tissue, is subjected to the main magnetic field, the individual magnetic moments of the spins in the tissue attempt to align with the main magnetic field. When excited by an RF wave, the spins precess about the main magnetic field at a characteristic Larmor frequency. A signal is emitted by the excited spins and processed to form an image.

However, in operation, variations may occur in the strength of the main magnetic field. Such variations in the main magnetic field may affect the acquired images. For example, when a conventional MRI system generates a main magnetic field of, for example, 3 Tesla, the variation of the main magnetic field due to the magnetic susceptibility of human body may be on the order of approximately 100 Hz. Therefore, when the conventional MRI system is utilized to perform, for example, breast imaging, a 100 Hz variation may adversely affect fat saturation, breast MR spectroscopy, and/or Echo Planar Imaging (EPI) readout. In particular, EPI pixel shift and distortion caused by the main magnetic field variation may reduce spatial resolution and/or decrease the Signal-to-Noise (SNR) of diffusion-weighted imaging.

BRIEF DESCRIPTION

In accordance with an embodiment, a method of generating a magnetic resonance (MR) image is provided. The method includes applying a localized magnetic field to a portion of a patient, determining a difference between a local field strength around a first region of interest and a local field strength around a different second region of interest, adjusting the local field strength around the first region of interest such that the local field strength around the first region of interest is substantially the same as the local field strength around the second region of interest, and generating an image of the first and second regions after adjusting the local field strength around the first region of interest.

In accordance with another embodiment, a shim coil apparatus for correcting localized non-uniformities in multiple local regions of a main magnetic field is provided. The shim coil apparatus includes a plurality of shim coils connected to a current source, the plurality of shim coils positioned adjacent a first localized region of a subject being imaged such that current flowing through the plurality of shim coils generates a localized magnetic field, a computer coupled to the plurality of shim coils. The computer is programmed to determine a difference between a local field strength around the first localized region and a local field strength around a different second localized region, and adjust the local field strength around the first region such that the field strength around the first region is substantially the same as the local field strength around the second region.

In accordance with a further embodiment, a Magnetic Resonance Imaging (MRI) system is provided. The MRI system includes a main magnet configured to generate a main magnetic field within a bore of the imaging system, a coil apparatus configured to be inserted into the bore of the imaging system, and a computer. The computer is programmed to determine a difference between a local field strength around a first localized region and a local field strength around a different second localized region, and adjust the local field strength around the first region such that the field strength around the first region is substantially the same as the local field strength around the second region.

DETAILED DESCRIPTION

Embodiments described herein will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "hav- "ing" an element or a plurality of elements having a particular property may include additional such elements not having that property.

Various embodiments provide an apparatus and method for improving bilateral breast shimming using a pair of localized breast shim coils. In various embodiments, a pair of shim coils is positioned around a single breast. A difference in the magnetic fields around each breast is then determined. Based on the determined difference, a current is input to the pair of shim coils to substantially balance the magnetic fields around the right and left breast without taking into account the main magnetic field strength.

Figure 1:
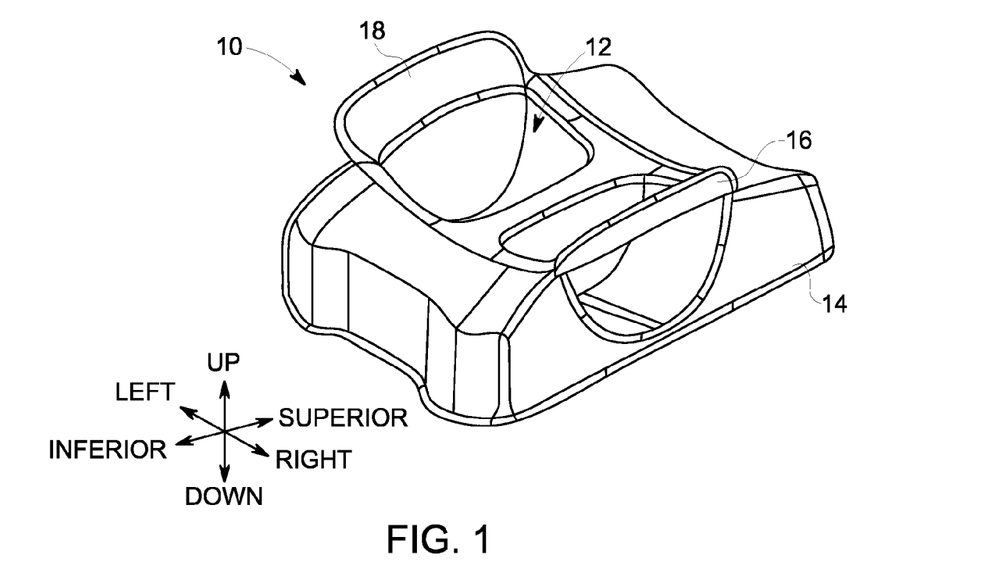
FIG. 1 is a perspective view of an MRI coil apparatus formed in accordance with various embodiments.

FIG. 1 is a perspective view of an MRI coil apparatus 10 formed in accordance with various embodiments. The coil apparatus 10 includes a coil chamber 12, a bottom housing 14, a right wing 16 and a left wing 18. In operation, the apparatus 10 provides support to a patient's torso to enable at least a portion of the patient to be imaged. In various embodiments, the coil apparatus 10 is configured to provide support to a patient's torso including the patient's breasts during the MRI imaging procedure.

Figure 2:
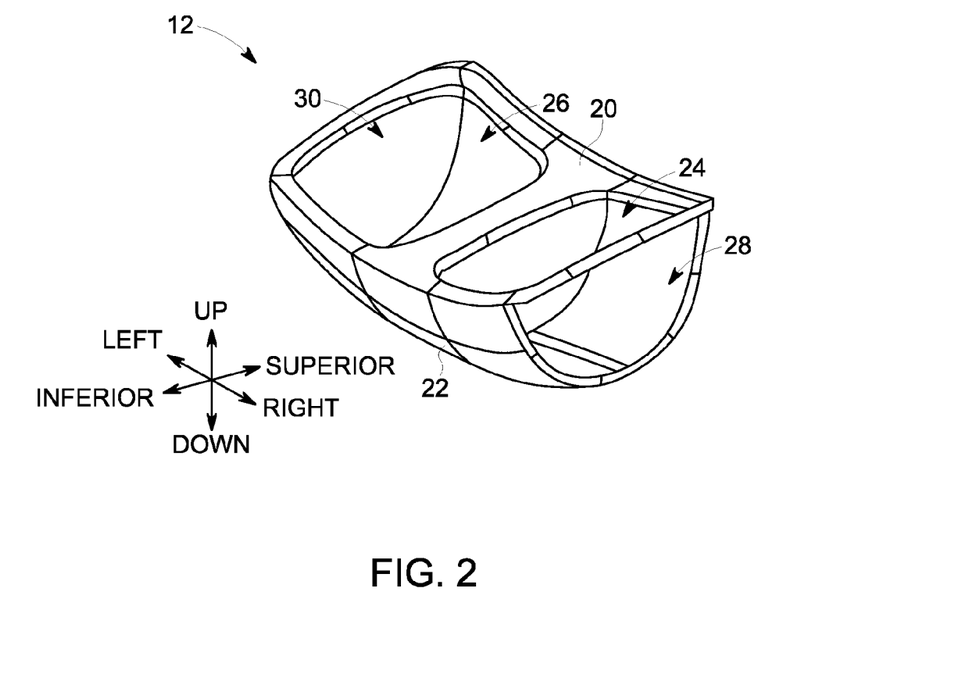
FIG. 2 is a perspective view of a portion of the MRI coil apparatus shown in FIG. 1.

FIG. 2 is a perspective view of the coil chamber 12 shown in FIG. 1. The coil chamber 12 is formed to include a top portion 20. A right opening 24 and a left opening 26 are provided on the top portion 20 to receive the imaged objects (e.g., the left and right breasts of a human). The ends of the coil chamber 12 also are open forming two windows 28 (right window) and 30 (left window), to allow access from both ends of the main coil chamber 12. The two wings 16 and 18 may be provided on rigid or semi-flexible formers that may be attached to the two ends of the top portion 20 as shown in FIG. 1. In use, a patient lies face downward (i.e., prone) on the coil apparatus 10, which provides support to the patient's torso, with a chest of the patient torso contacting or touching the top portion 20. It should be noted that the superior direction is into the plane of the FIG. 2 and the inferior direction is out of the plane of FIG. 2. The right and left openings 24 and 26 on the top portion 20 receive the right and left breasts, respectively, there through, to enable at least a portion of the right and left breasts to extend at least partially into the coil chamber 12.

Figure 3:
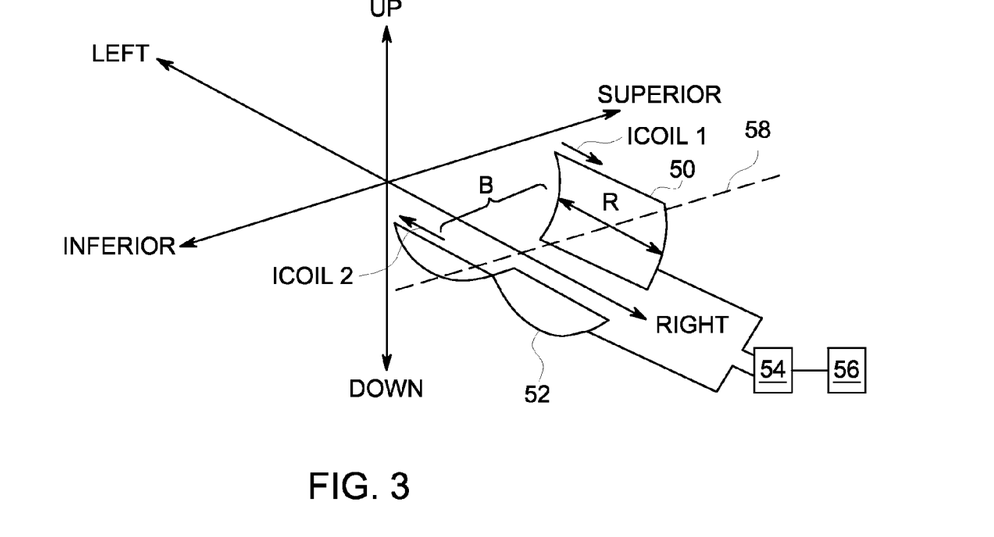
FIG. 3 is a perspective view of exemplary coil elements that may be installed within the coil apparatus shown in FIG. 1.

FIG. 3 is a perspective view of exemplary coil elements that may be installed within the coil chamber 12 to enable the left and right breasts to be imaged using the MRI system. In the exemplary embodiment, the coil apparatus 10 includes at least a first shim coil 50 and a second shim coil 52. The first and second shim coils 50 and 52 are installed within the coil chamber 12, proximate to the right opening 24 such that when the patient's right breast is inserted through the right opening 24, the shim coils 50 and 52 are disposed proximate to the right breast. More specifically, in operation the magnetic field $B_0$ around the right breast may be different than the magnetic field around the left breast because of anatomical differences. For example, the lungs are located behind the right breast and the heart and a portion of the lungs are located behind the left breast. Thus, these anatomical differences may cause the magnetic field $B_0$ around the right breast to be different than the magnetic field $B_0$ around the left breast.

Optionally, the shim coils 52 may be installed within the coil chamber 12, proximate to the left opening 26 such that when the patient's left breast is inserted through the left opening 26, the shim coils 50 and 52 are disposed proximate to the left breast. In various embodiments, the shims coils 50 and 52 are disposed on the superior and inferior sides of the breast. In other embodiments, the shims coils 50 and 52 may be disposed on the right and left sides of the breast.

It should be realized that although the exemplary embodiment illustrates two shim coils 50 and 52 disposed around a single breast, other configurations are contemplated. For example, other embodiments may include more than two shim coils disposed around a single breast or two or more shim coils disposed around each breast. For example, there may be 2, 3, 4, 5 or more pairs of shim coils located around a single breast.

In operation, a shim coil controller 54 is utilized to provide a current signal to the shim coils 50 and 52, as is discussed in more detail below. Thus, in the exemplary embodiment, the controller 54 is configured to function as a current source. The shim coil controller is controlled by a computer 56. A set of instructions may be stored on the computer 56 and utilized to control the operation of the controller 54 and therefore also control the operation of the shim coils 50 and 52.

Figure 4:
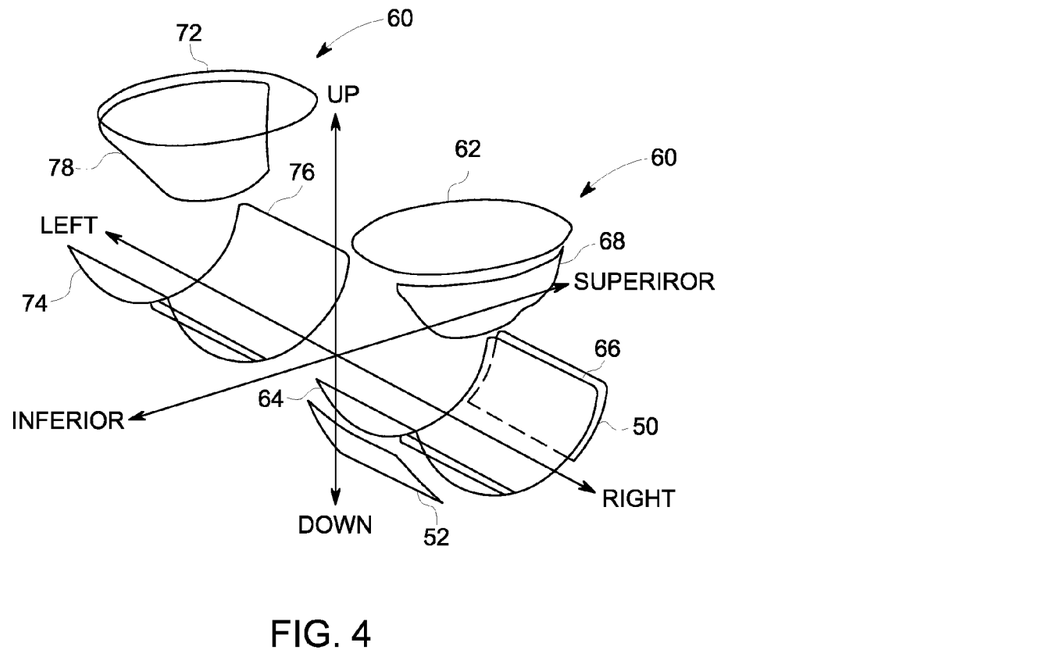
FIG. 4 is a perspective view of additional coil elements that may be installed within the coil apparatus shown in FIG. 1.

The shim coils 50 and 52 may be utilized with any local or surface coil. For example, the shim coils 50 and 52 may be used in conjunction with the local coil shown in FIG. 4. Specifically, FIG. 4 is a perspective view of another set of exemplary coil elements that may be installed within the coil chamber 12 to enable the left and right breasts to be imaged using the MRI system. In various embodiments, the coil apparatus 10 may include a set 60 of RF coils and the shim coils 50 and 52 discussed above. The set 60 of RF coils may include, for example, four loop coils 62, 64, 66 and 68 for right breast imaging and four loop coils 72, 74, 76 and 78 for left breast imaging. Accordingly, in the exemplary embodiment, the coil apparatus 10 may include eight RF coils. Loop coils 62 and 72 are provided, respectively, around the right and left openings 24 and 26 (shown in FIG. 2) for imaging the right breast and the left breast of the patient. Loop coils 68 and 78 are provided, respectively, around the right and left windows 28 and 30 (shown in FIG. 2 of the coil chamber 12 to provide lateral coverage for the right and left breasts. Loop coils 64 and 66 are provided in the superior-inferior direction to receive signals mainly from the lower portion of right breast. Loop coils 74 and 76 are similarly provided in the superior-inferior direction to receive signals mainly from the lower portion of left breast. The RF coils 62, 64, 66, 68, 72, 74, 76, 78 may be configured to detect magnetic signal pulses and/or optionally transmit MR signals to the patient.

The various embodiments may be implemented in different arrangements. For example, the shim coils 50 and 52 may be utilized with a whole body coil. The shim coils 50 and 52 may be utilized with or without RF coils. The shim coils 50 and 52 may be utilized with different coil formers and located in various positions to enhance imaging.

Figure 5:
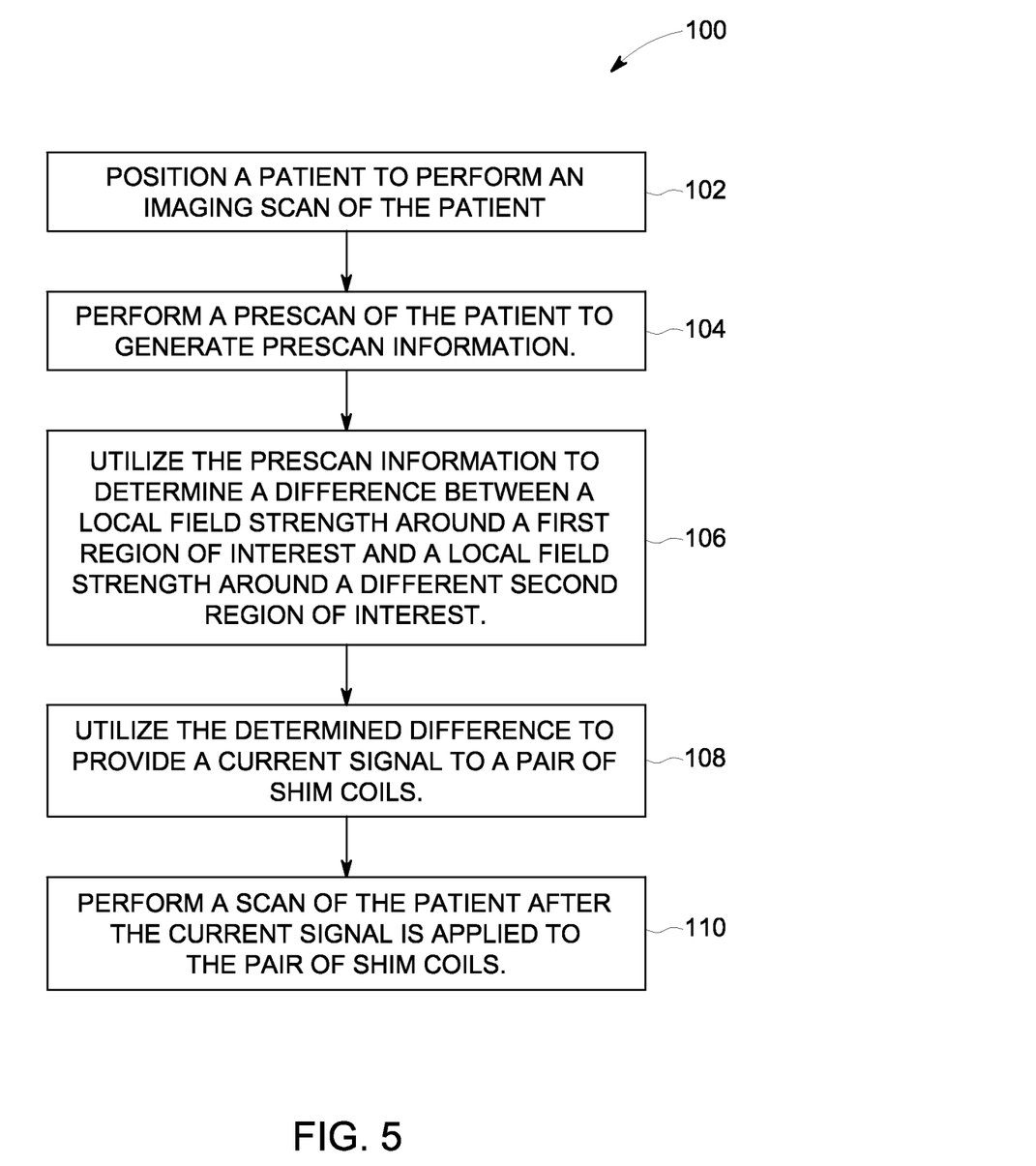
FIG. 5 is a flowchart of an exemplary method for generating a MRI image in accordance with various embodiments.

FIG. 5 is a flowchart of an exemplary method 100 for generating a MRI image of an object utilizing the coil apparatus 10 shown in FIGS. 1-4. The method 100 may be embodied as a set of instructions that are stored on the computer 56, for example.

At 102, a patient is positioned to perform an imaging scan. More specifically, a device, such as the coil apparatus 10 is positioned on an imaging table. The patient is then positioned on the coil apparatus 10 such that the patient's right breast is inserted into the right opening 24 and the left breast is inserted into the left opening 26 of the coil apparatus 10, such that the patient is in the prone position, with one of the breasts positioned between the shim coils 50 and 52. The table is then moved into the bore of the imaging system.

At 104, a prescan of the patient is performed. The prescan includes operating the imaging system to generate a magnetic field homogeneity map. The homogeneity map is a measurement of the spatial perturbations in the main magnetic field $B_0$.

A method of acquiring said homogeneity map is to use gradient echo imaging to acquire two MR phase images wherein one phase image is acquired at one specific echo time ($TE_1$) and a second image is acquired at a different echo time ($TE_2$). The difference of the phase images divided by a constant scaling factor (proportional to the difference in echo times) generates the homogeneity map.

Another method of acquiring a homogeneity map, especially useful in regions that contain 2 or more chemical species (.i.e. water and fat), is iterative processing. Iterative processing includes acquiring 2 or more MR images at different echo times and combining them with an iterative process to estimate the homogeneity map and the chemical species map at the same time.

At 106, the responses produced at 104 are utilized to determine a difference ($\delta B_{12}$) between a local field strength $B_1$ around a first region of interest and a local field strength $B_2$ around a different second region of interest. In the exemplary embodiment, the first region of interest is the left breast and the second region of interest is the right breast. In this example, and descriptions of at least one embodiment, the left breast is defined as 154 and the right breast is defined as 152 in FIG. 6, regardless of the actual anatomy of the subject imaged in FIG. 6. It should be realized that in operation, when the main magnetic field $B_0$ is applied to the patient, various magnetic fields, having different field strengths are formed in various regions of the patient. For example, when the patient is imaged using a main magnetic field $B_0$ having, for example, a strength of 3 Tesla (3 T), the asymmetry in the anatomy, e.g., possible geometrical asymmetry between the left and right breasts and the asymmetry of organs behind them, generally causes the strength of the magnetic field $B_1$ formed around the right breast to be different than the strength of the magnetic field $B_2$ formed around the left breast. For example, FIG. 6 illustrates an exemplary homogeneity map 150 that may be utilized to determine the difference ($\delta B_{12}$) between field strength $B_1$ and the field strength $B_2$.

Figure 6:
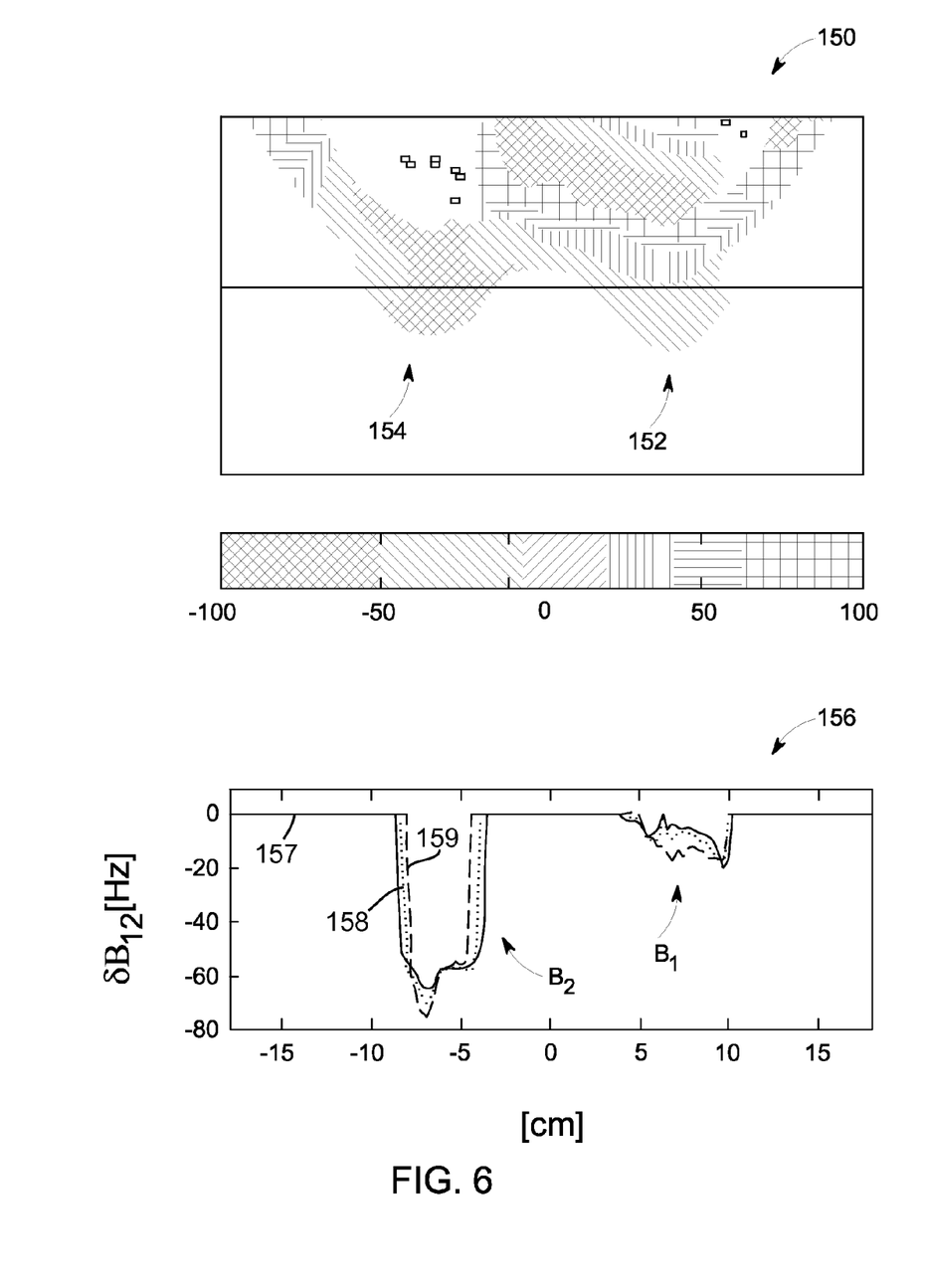
FIG. 6 is an exemplary homogeneity map that may be generated in accordance with various embodiments.

More specifically, the top portion of FIG. 6 is a visual representation of the difference ($\delta B_{12}$) between the field strength $B_1$ around the right breast 152 and the field strength $B_2$ around the left breast 154. The top portion 150 utilizes different levels of shading to visually represent the magnitude of the magnetic fields around the right and left breasts, 152 and 154, respectively. Moreover, the bottom portion 156 of FIG. 6 is a graphical illustration of the difference ($\delta B_{12}$) wherein the X-axis represents the scan Field of View (FOV) in centimeters (cm) and the Y-axis represents the field strengths ($B_1$, $B_2$). The bottom portion 156 utilizes graphical lines to illustrate the magnitude of the field strength $B_2$ around the left breast 154 and $B_1$ around the right breast 152. Moreover, several lines 157, 158, and 159 are illustrated, wherein each of the lines 157, 158, and 159 represent a line cut of the breasts around the horizontal line in the top portion of 150. As shown in FIG. 6, the field strength $B_1$ around the right breast 152 is substantially higher than the field strength $B_2$ around the left breast 154. As discussed above, the difference in the field strengths $B_1$ and $B_2$ are typically caused by the anatomical differences between the structures lying beneath the right and left breasts 152 and 154, respectively.

Accordingly, at 106, a difference ($\delta B_{12}$) between the local field strength around the right breast $B_1$ and the local field strength around the left breast $B_2$ is determined. In one embodiment, the difference ($\delta B_{12}$) may be determined by acquiring a plurality of images at two different echo times. More specifically, the scan time of the imaging system may be adjusted, using, for example, a prescan algorithm such as an Autoshim feature. The Autoshim feature enables the operator to define the FOV and various other imaging parameters. Three orthogonal slices of the breasts may then be acquired. As a result, taking the differences between these the images, acquired at two different echo times, the dephasing occurring between the two imaging times may be determined. The dephasing information, which is proportional to the magnetic field strength, may then be utilized to determine ($\delta B_{12}$). In another embodiment, the operator may visually inspect the homogeneity map 150 and/or the graphical representation 156 to determine ($\delta B_{12}$). For example, the operator may choose to display the image shown in FIG. 6. Based on the image shown in FIG. 6, the operator can readily determine the magnitude of the magnetic fields around each breast. Based on this information, the operator may then modify the magnetic field around one of the breasts using the shim coils 50 and 52.

Figure 7:
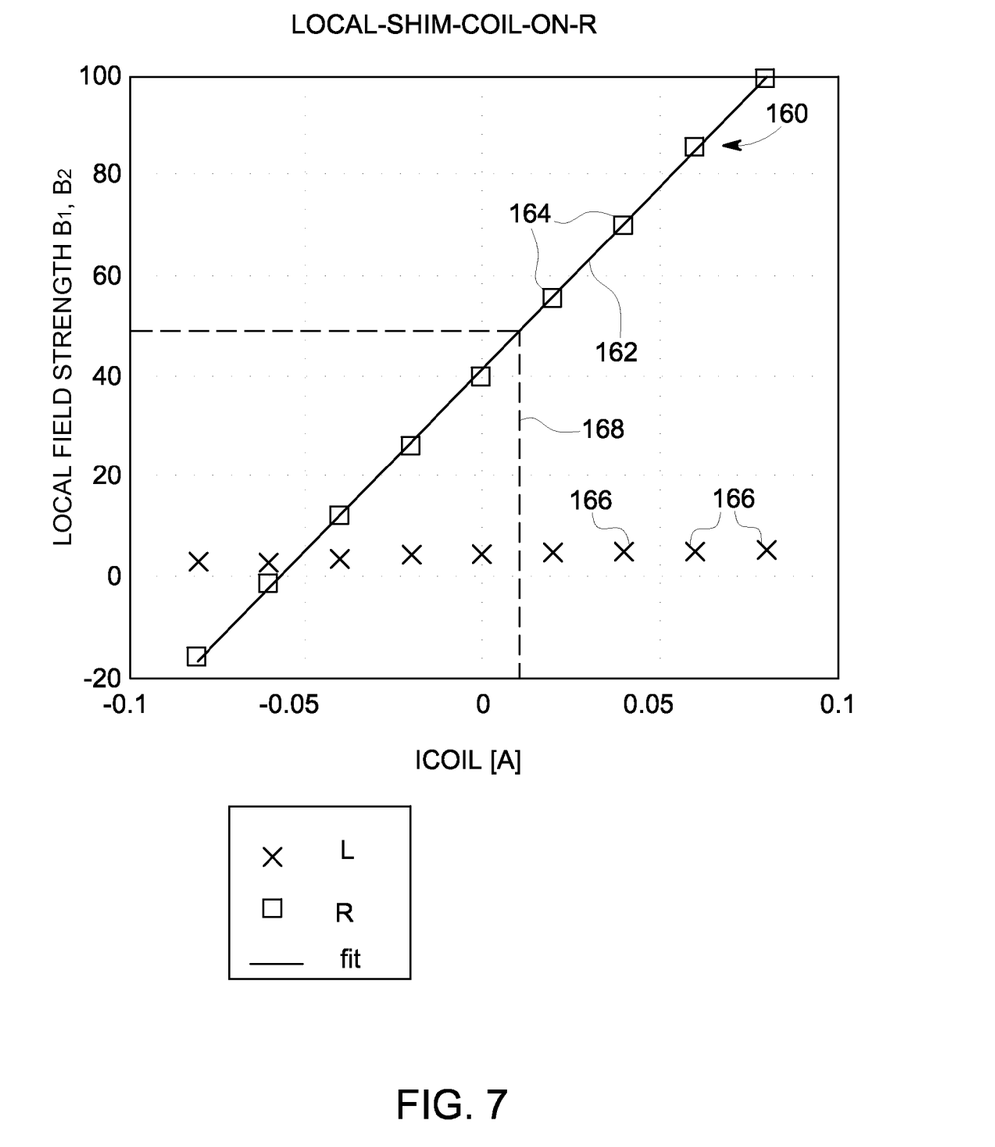
FIG. 7 is an exemplary calibration curve that may be generated in accordance with various embodiments.

At 108, the difference ($\delta B_{12}$) determined at 106 is utilized to provide a current signal to the shim coils 50 and 52. In the exemplary embodiment, a calibration curve, such as a calibration curve 160 shown in FIG. 7, is utilized to determine the quantity of current to be delivered to the pair of shim coils 50 and 52. The calibration curve 160 is preferably generated using a priori information on the size and number of turns of the coils and patient information. As shown in FIG. 7, the X-axis represents a compensating current ($I_{coil}$) to be supplied to the shim coils 50 and 52. The Y-axis represents the local field strengths $B_1$, $B_2$. The line 162, and squares 164 represent the calibration curve 160 and the X's 166 illustrates that no current is being supplied to the left breast. For example, assuming that the difference ($\delta B_{12}$) identified at 106 is 50 Hz, which is also referred to herein as the center frequency, then utilizing the calibration curve 160, it can be determined that the amount of current to be supplied to the shim coils 50 and 52 to make the $B_1$ field homogenous to the $B_2$ field, i.e. to make $\delta B_{12} \approx 0$, is approximately 100 mA as denoted by the line 168.

It should be realized that the amount of the compensating current ($I_{coil}$) supplied to the shim coils 50, 52 to generated the desired magnetic field is based on the size and configuration of the shim coils 50, 52. In the exemplary embodiment, the shim coil 50 is the same size and has the same number of turns as the shim coil 52. In other embodiments, the shim coil 50 may be a different size and/or have a different number of turns than the shim coil 52. As discussed above, the shim coils 50 and 52, in the exemplary embodiment, are place symmetrically around the right breast. More specifically, and referring again to FIG. 3, the shim coils 50 and 52 are placed such that the shim coil 50 is positioned on the superior side of the breast and the shim coil 52 is positioned on the inferior side of the right breast and remains symmetrical with the shim coil 50 along a common axis 58 extending through the right breast and are separated by a distance D that is substantially equal to a radius R of each of the shim coils 50 and 52.

In the exemplary embodiment, each shim coil 50 and 52 is configured to receive a compensating current ($I_{coil}$) that is sufficient to make the $B_1$ field substantially homogenous to the $B_2$ field, i.e. to make $\delta B_{12} \approx 0$. Referring again to FIG. 3, the coils 50 and 52 may be configured as a Helmholtz-like coil pair. Accordingly, in one embodiment, when the magnetic field strength $B_1$ around the right breast 152 is greater than the magnetic field strength $B_2$ around the left breast 154, a compensating current $I_{coil1}$ transmitted through the coil 50 is substantially equal to, and has the same polarity as a compensating current $I_{coil2}$ that is transmitted through the coil 52. In another embodiment, when the magnetic field strength $B_1$ around the right breast 152 is less than the magnetic field strength $B_2$ around the left breast 154, the compensating current $L_{coil1}$ transmitted through the coil 50 and $L_{coil1}$ through the coil 52 are both reversed in polarity. In yet another embodiment, when the magnetic field gradient around the right breast 152 is substantially different than the magnetic field gradient around the left breast 154, the compensating currents $I_{coil1}$ and $I_{coil2}$ may be supplied with opposite polarity.

It should be realized that the magnitude and polarity of the compensating currents $I_{coil1}$ and $I_{coil2}$ that is provided to the coils 50 and 52 to make the $B_1$ field substantially homogenous to the $B_2$ field, is based on the quantity of turns within the coil 50 and 52. For example, in the exemplary embodiment, the difference ($\delta B_{12}$) is approximately 50 Hz. Thus, the magnitude of the compensating current $I_{coil}$ provided to the shim coils 50 and 52 to make the $B_1$ field homogenous to the $B_2$ field, i.e. to make $\delta B_{12} \approx 0$, is approximately 100 mA as shown in FIG. 7. To generate 100 mA, each of the coils 50 and 52 is wound to include approximately 10 turns. However, it should be realized that the quantity of turns is based on the desired center frequency which in this case is 50 Hz. Additionally, It should be further realized that while the exemplary embodiment discusses a main magnetic field strength $B_0$ of 3 T, and all the above values are based on a 3 T value, the quantity of turns in each coil 50 and 52, and the current supplied to each coil 50 and 52 may vary based on the strength of $B_0$. For example, assuming that the strength of the $B_0$ is approximately 7 T, then the amount of the compensating current $I_{coil}$ transmitted through the coils 50 and 52 would be approximately 230 mA if the quantity of turns in each coil 50 and 52 stays the same.

Figure 8:
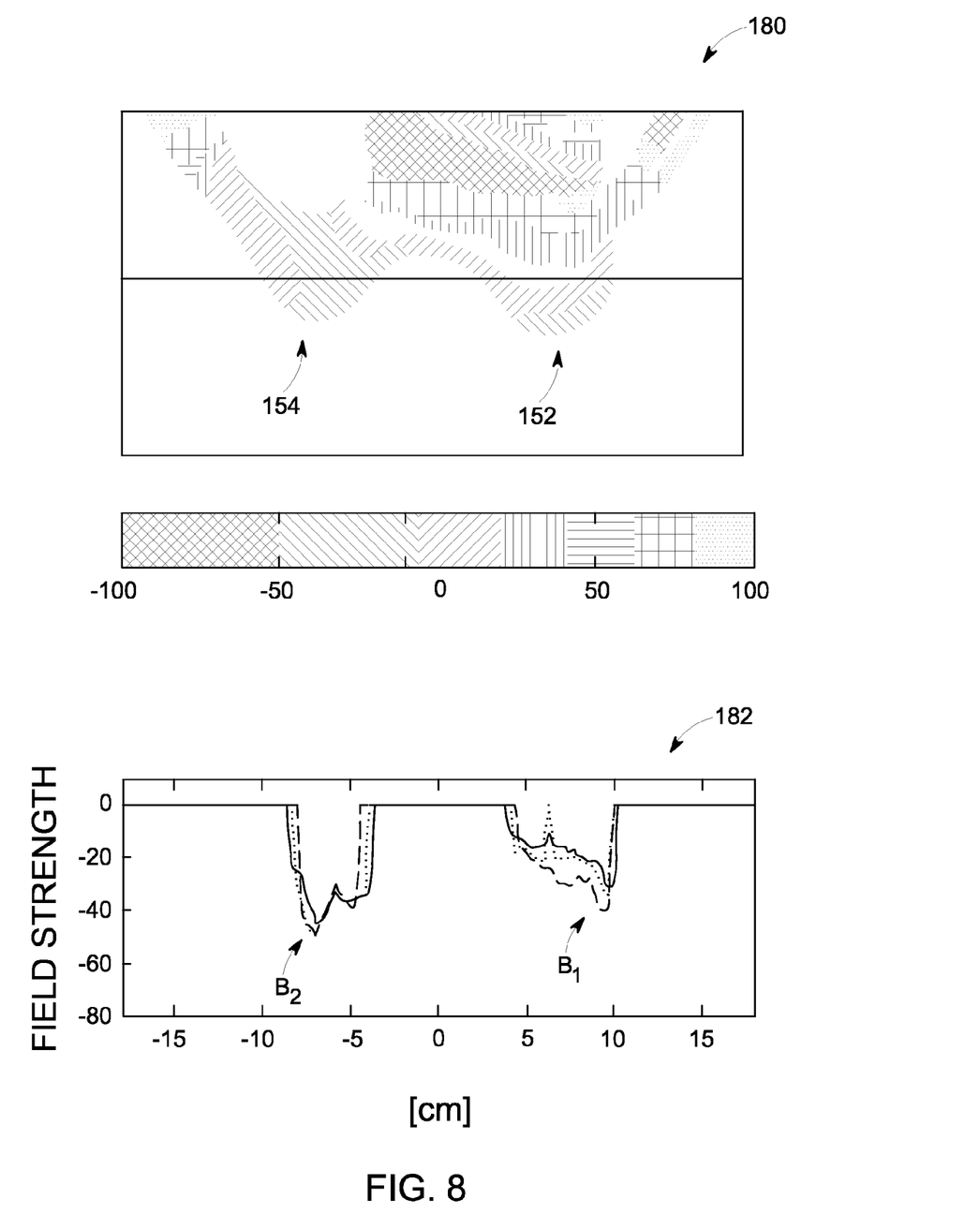
FIG. 8 is another exemplary homogeneity map that may be generated in accordance with various embodiments.

FIG. 8 is another exemplary homogeneity map 180 that illustrates magnetic fields $B_1$ and $B_2$, around the right and left breasts, respectively, after the current has been supplied to the coils 50 and 52 as discussed above. More specifically, the top portion of FIG. 8 is a visual representation of the $B_1$ field strength around the right breast 152, after the compensating current ($I_{coil}$) is input to the coils 50 and 52, and the $B_2$ field strength around the left breast 154. Moreover, the bottom portion 182 of FIG. 8 is a graphical illustration of the $B_1$ and $B_2$ fields, wherein the X-axis represents the FOV in centimeters (cm) and the Y-axis represents the magnitude of the fields $B_1$ and $B_2$ fields. As shown in FIG. 8, and in the exemplary embodiment, the field strength $B_1$ around the right breast 152, after the compensating current $I_{coil}$ is supplied to the coils 50 and 52, is now substantially equal to the field strength $B_2$ around the left breast 154.

Referring again to FIG. 5, at 110, after the compensating current $I_{coil}$ is supplied to the coils 50 and 52, the patient is scanned to generate an image of the patient. In the exemplary embodiment, the compensating current $I_{coil}$ is continuously supplied to the shim coils 50 and 52 while image data of the breasts is being acquired. In another embodiment, $I_{coil}$ is applied only during a part or parts of the imaging sequence, for example, during spectral excitation, fat suppression, and/or EPI readout.

Figure 9:
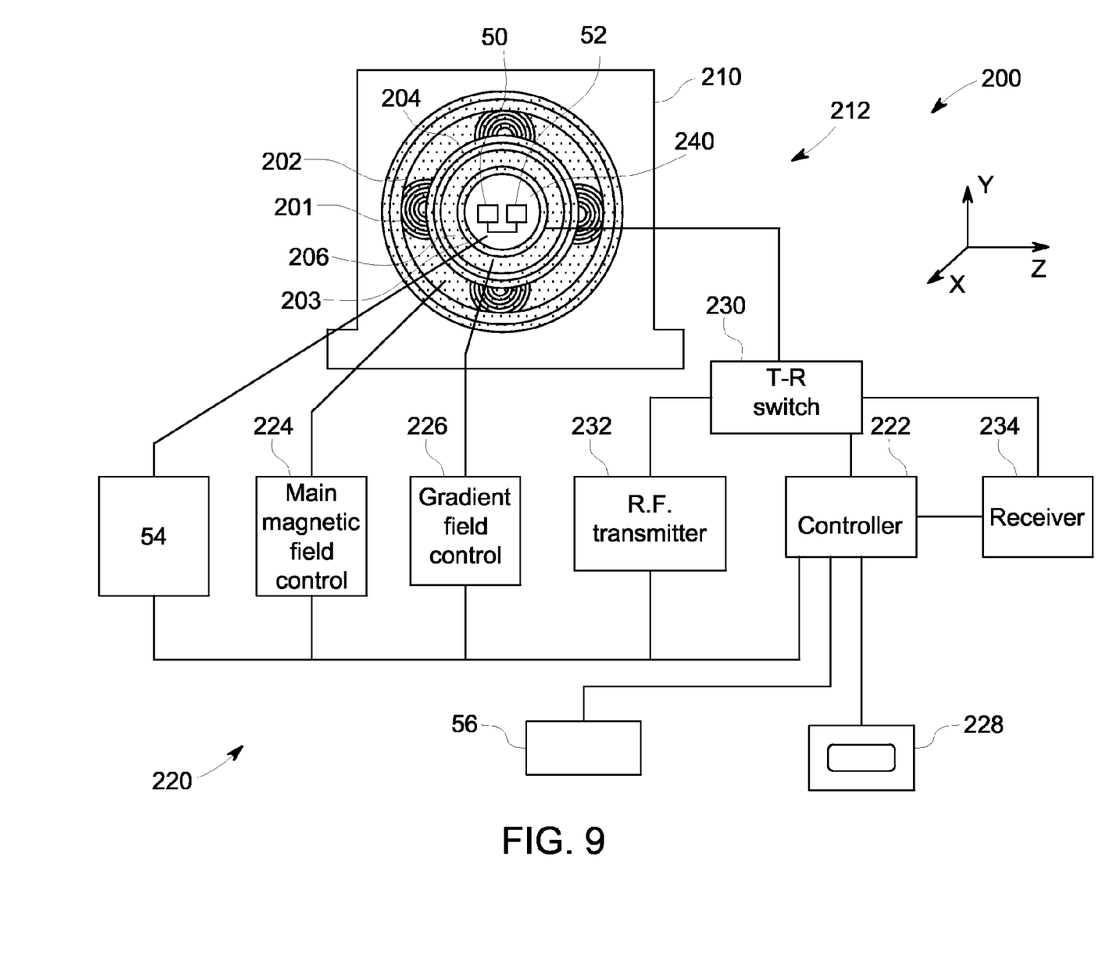
FIG. 9 is a schematic block diagram of an MRI system formed in accordance with various embodiments.

FIG. 9 is a schematic illustration of an exemplary imaging system 200 that may be utilized with the coil apparatus 10, shown in FIGS. 1-4, to implement the method 100 described herein. In the exemplary embodiment, the imaging system 200 also includes a superconducting magnet 201 formed from magnetic coils supported on a magnet coil support structure. However, in other embodiments, different types of magnets may be used, such as permanent magnets or electromagnets. A vessel 202 (also referred to as a cryostat) surrounds the superconducting magnet 201 and is filled with liquid helium to cool the coils of the superconducting magnet 201. A thermal insulation 204 is provided surrounding the outer surface of the vessel 202 and the inner surface of the superconducting magnet 201. A plurality of magnetic gradient coils 206 are provided within the superconducting magnet 201 and an RF transmit coil 203 is provided within the plurality of magnetic gradient coils 206. In some embodiments the RF transmit coil 203 may be replaced with a transmit and receive coil as described in more detail herein.

The imaging system 200 also includes the MRI coil apparatus 10 which includes the pair of shim coils 50 and 52, which in operation are disposed within the bore of the imaging system 200. The components described above are located within a gantry 210 and generally form an imaging portion 212. It should be noted that although the superconducting magnet 201 is a cylindrical shaped, other shapes of magnets can be used.

A processing portion 220 generally includes the controller 54 for operating the shim coils 50 and 52, a controller 222, a main magnetic field control 224, a gradient field control 226, the computer 56, a display device 228, a transmit-receive (T-R) switch 230, an RF transmitter 232 and a receiver 234. In the exemplary embodiment, the computer 56 is programmed to determine a difference in the magnetic fields around each breast using the shim coils 50 and 52. Based on the determined difference, the computer 56 operates the controller 54 to output a current that is input to the pair of shim coils 50 and 52 to substantially balance the magnetic fields around the right and left breast without taking into account the main magnetic field strength.

In operation, a body of an object, such as a patient (not shown), is placed on the coil apparatus 10 as described above. The patient after being positioned on the coil apparatus 10 (shown in FIG. 1) is then inserted into a bore 240 of the imaging system 200. The superconducting magnet 201 produces an approximately uniform and static main magnetic field $B_0$ across the bore 240. The strength of the electromagnetic field in the bore 240 and correspondingly in the patient, is controlled by the controller 222 via the main magnetic field control 224, which also controls a supply of energizing current to the superconducting magnet 200.

The magnetic gradient coils 206, which include one or more gradient coil elements, are provided so that a magnetic gradient can be imposed on the magnetic field $B_0$ in the bore 240 within the superconducting magnet 201 in any one or more of three orthogonal directions x, y, and z. The magnetic gradient coils 206 are energized by the gradient field control 226 and are also controlled by the controller 222.

The RF transmit coil 203, which may include a plurality of coils (e.g., resonant surface coils), is arranged to transmit magnetic pulses and/or optionally simultaneously detect MR signals from the patient if receive coil elements are also provided, such as a surface coil (not shown) configured as an RF receive coil. The RF transmit coil 203 and the receive surface coil are selectably interconnected to one of the RF transmitter 232 or the receiver 234, respectively, by the T-R switch 230. The RF transmitter 232 and T-R switch 230 are controlled by the controller 222 such that RF field pulses or signals are generated by the RF transmitter 232 and selectively applied to the patient for excitation of magnetic resonance in the patient.

Following application of the RF pulses, the T-R switch 230 is again actuated to decouple the RF transmit coil 203 from the RF transmitter 232. The detected MR signals are in turn communicated to the controller 222. The detected signals are then utilized to determine a difference in the magnetic fields around each breast and input a current signal to the shim coils 50 and 52. The patient is then scanned and the processed signals representative of an image are also transmitted to the display device 228 to provide a visual display of the image.

A technical effect of some of the various embodiments described herein is to improve image quality, while concurrently reducing the time required to perform a MRI scan. More specifically, various embodiments described herein provide a method to improve bilateral breast shimming using a pair of localized breast shim coils. In various embodiments, a pair of shim coils is positioned around a single breast. The geometry of the shim coils may be optimized for average breast anatomy. More specifically, the size of the shim coils, the quantity of turns in the shim coils, and the current input to the shim coils is based on the breast anatomy of an average patient. However, it should be realized that the size of the shim coils, the quantity of turns in the shim coils, and the current input to the shim coils may be determined to accommodate any sized breasts. In various embodiments, the shim coils are installed in a coil housing to facilitate determining the magnetic fields around each breast. In various embodiments, the shim coils are aligned to apply primarily a longitudinal field parallel to the main magnetic field. In various embodiments a single pair of shim coils is configured to surround a single breast. For example, the single pair of shim coils may be placed around the right breast to compensate for left-right asymmetry in the resonance frequency. Optionally, the single pair of shim coils may be placed around the left breast. The pair of shim coils is configured to generate a breast-specific magnetic field profile that accommodates for magnetic field asymmetry between the two breasts.

Various embodiments described herein provide a tangible and non-transitory machine-readable medium or media having instructions recorded thereon for a processor or computer to operate an imaging apparatus to perform an embodiment of a method described herein. The medium or media may be any type of CD-ROM, DVD, floppy disk, hard disk, optical disk, flash RAM drive, or other type of computer-readable medium or a combination thereof.

The various embodiments and/or components, for example, the monitor or display, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A method of generating a Magnetic Resonance (MR) image comprising:
    applying a localized magnetic field to a portion of a patient, wherein compensating current is supplied to a plurality of shim coils during an imaging sequence while image data is being acquired, and wherein the compensating current has a magnitude and a polarity to make the $B_1$ field substantially homogenous to the $B_2$ field;
    determining a difference between a local field strength around a first region of interest and a local field strength around a different second region of interest;
    wherein said first region of interest includes a first breast and said second region of interest includes a second breast;
    adjusting the local field strength around the first region of interest such that the local field strength around the first region of interest is substantially the same as the local field strength around the second region of interest; and
    generating an image of the first and second regions of interest after adjusting the local field strength around the first region of interest.

2. The method of claim 1, wherein a pair of shim coils is positioned around the first region of interest, the method further comprising adjusting a current flow through the pair of shim coils until the local field strength around the first region of interest is substantially the same as the local field strength around the second region of interest.

3. The method of claim 1, wherein a pair of shim coils is positioned around the first region of interest, the method further comprising adjusting a current flow through the pair of shim coils until the local field strength around the first region of interest is substantially the same as the local field strength around the second region of interest and different than a field strength of a main magnetic field.

4. The method of claim 1, wherein the first and second regions of interest comprise a right breast and a left breast, and wherein a pair of shim coils is positioned only around the right breast, the method further comprising adjusting a current flow through the pair of shim coils until the local field strength around the right breast is substantially the same as the local field strength around the left breast.

5. The method of claim 1, further comprising utilizing the determined difference to generate a compensating current that is input to a pair of shim coils, the compensating current configured to modify the local field strength around the first region of interest such that the field strength around the first region of interest is substantially the same as the local field strength around the second region of interest.

6. The method of claim 1, further comprising:
generating a homogeneity map from the difference of two MR phase images wherein a first MR image is acquired at one echo time and a second MR image is acquired at a different echo time;
generating a homogeneity map from processing the two MR images using an iterative processing method; and
determining a difference between a local field strength and gradient around the first region of interest and a local field strength and gradient around the second region of interest using the homogeneity map.

7. A shim coil apparatus for correcting localized non-uniformities in multiple local regions of a main magnetic field in a Magnetic Resonance Imaging (MRI) system comprising:
a plurality of shim coils connected to a current source, the plurality of shim coils positioned adjacent a first localized region of a subject being imaged such that current flowing through the plurality of shim coils generates a localized magnetic field; and
a computer coupled to the plurality of shim coils programmed to:
apply a localized magnetic field to a portion of a patient, wherein compensating current is supplied to the plurality of shim coils during an imaging sequence while image data is being acquired, and wherein the compensating current has a magnitude and a polarity to make the $B_1$ field substantially homogenous to the $B_2$ field;
determine a difference between a local field strength around the first localized region and a local field strength around a different second localized region;
wherein said first localized region includes a first breast and said second localized region includes a second breast;
adjust the local field strength around the first region such that a local field strength around the first region is substantially the same as a local field strength around the second region;
determine a difference between a local field gradient around the first localized region and a local field gradient around a different second localized region; and
adjust the local field gradient around the first region such that a local field gradient around the first region is substantially the same as a local field gradient around the second region.

8. The shim coil apparatus of claim 7, wherein the plurality of shim coils comprises a pair of shim coils positioned adjacent to a right breast.

9. The shim coil apparatus of claim 7, wherein the computer is further programmed to adjust a current flow through the plurality of shim coils until the local field strength around the first region is substantially the same as the local field strength around the second region and different than a field strength of a main magnetic field.

10. The shim coil apparatus of claim 7, wherein the first and second regions comprise a first breast and a second breast, and wherein a pair of shim coils is positioned only around the first breast.

11. The shim coil apparatus of claim 7, wherein the coil apparatus is configured to be received within a bore of a Magnetic Resonance Imaging (MRI) system.

12. The shim coil apparatus of claim 7, further comprising a first opening for receiving a right breast and a second opening for receiving a left breast.

13. The shim coil apparatus of claim 7, wherein the plurality of shim coils comprises a pair of Helmholtz coils.

14. The shim coil apparatus of claim 7, wherein the plurality of shim coils comprises a pair of anti-Helmholtz coils.

15. A Magnetic Resonance Imaging (MRI) system comprising:
a main magnet configured to generate a main magnetic field within a bore of the imaging system;
a coil apparatus configured to be inserted into the bore of the imaging system; and
a plurality of shim coils wherein compensating current is supplied to a plurality of shim coils during an imaging sequence while image data is being acquired, and wherein the compensating current has a magnitude and a polarity to make the $B_1$ field substantially homogenous to the $B_2$ field;
a computer programmed to:
determine a difference between a local field strength around a first localized region and a local field strength around a different second localized region;
wherein said first localized region includes a first breast and said second localized region includes a second breast; and
adjust the local field strength around the first region such that the local field strength around the first region is substantially the same as the local field strength around the second region.

16. The Magnetic Resonance Imaging (MRI) system of claim 15, wherein the coil apparatus comprises a pair of shim coils and the first localized region comprises a breast.

17. The Magnetic Resonance Imaging (MRI) system of claim 15, wherein the coil apparatus comprises a pair of Helmholtz coils and the first localized region comprises a right breast.

* * * * *

UNITED STATES PATENT AND TRADEMARK OFFICE
CERTIFICATE OF CORRECTION

PATENT NO.        : 8,981,778 B2
APPLICATION NO.   : 13/094602
DATED             : March 17, 2015
INVENTOR(S)       : Lee et al.

Page 1 of 1

It is certified that error appears in the above-identified patent and that said Letters Patent is hereby corrected as shown below:

In the specification,

In Column 4, Line 34, delete "FIG. 2" and insert -- FIG. 2) --, therefor.

In Column 6, Line 62, delete "Loin" and insert -- $I_{coil1}$ --, therefor.

In Column 7, Line 1, delete "current $L_{coil1}$" and insert -- current $I_{coil1}$ --, therefor.

In Column 7, Line 1, delete "and $L_{coil1}$" and insert -- and $I_{coil1}$ --, therefor.

In Column 8, Line 40, delete "magnet 200." and insert -- magnet 201. --, therefor.

Signed and Sealed this
Twentieth Day of October, 2015

Michelle K. Lee
*Director of the United States Patent and Trademark Office*